US006719206B1

(12) United States Patent
Bashan et al.

(10) Patent No.: US 6,719,206 B1
(45) Date of Patent: Apr. 13, 2004

(54) DATA TRANSACTION CARD AND METHOD OF MANUFACTURE THEREOF

(75) Inventors: Oded Bashan, Carmiel (IL); Nehemya Itay, Kfar Giladi (IL); Ronnie Gilboa, Beit Hillel (IL); Moshe Aduk, Korazim (IL)

(73) Assignee: On Track Innovations Ltd., Rosh Pina (IL)

(*) Notice: Subject to any disclaimer, the term of this patent is extended or adjusted under 35 U.S.C. 154(b) by 0 days.

(21) Appl. No.: 09/554,734

(22) PCT Filed: Nov. 9, 1998

(86) PCT No.: PCT/IL98/00543

§ 371 (c)(1),
(2), (4) Date: Aug. 1, 2000

(87) PCT Pub. No.: WO99/26197

PCT Pub. Date: May 27, 1999

(51) Int. Cl.$^7$ .............................................. G06K 19/06
(52) U.S. Cl. ................................... 235/492; 343/895
(58) Field of Search ............................. 235/487, 491, 235/492, 494, 380, 457; 359/1–3; 283/72–81; 438/106–127; 361/737; 343/866, 867, 895

(56) References Cited

U.S. PATENT DOCUMENTS

| | | | |
|---|---|---|---|
| 4,532,508 A | * 7/1985 | Ruell ........................ 340/5.83 |
| 5,206,495 A | 4/1993 | Kreft | |
| 5,428,214 A | 6/1995 | Hakkers et al. | |
| 5,598,032 A | 1/1997 | Fidalgo | |
| 5,757,521 A | 5/1998 | Walters et al. | |
| 5,838,235 A | 11/1998 | Thorigne | |
| 6,160,526 A | * 12/2000 | Hirai et al. .................. 343/895 |
| 6,170,880 B1 | * 1/2001 | Prancz ........................ 235/457 |
| 6,190,942 B1 | * 2/2001 | Wilm et al. .................. 438/107 |
| 6,375,083 B2 | * 4/2002 | Fries et al. .................. 235/380 |
| 6,378,774 B1 | * 4/2002 | Emori et al. ................. 235/492 |

FOREIGN PATENT DOCUMENTS

| | | | |
|---|---|---|---|
| AU | 713433 B2 | 12/1999 | |
| DE | 37 21 822 | 11/1988 | |
| DE | 195 30 608 A1 | 2/1997 | |
| DE | 19701167 A1 | * 7/1998 | ......... G06K/19/077 |
| JP | 411296639 A | * 10/1999 | ......... G06K/19/077 |
| WO | 96 35190 | 11/1996 | |
| WO | WO009815916 A1 | * 4/1998 | ......... G06K/19/077 |
| WO | 98 29830 | 7/1998 | |

OTHER PUBLICATIONS

Lisimaque et al., "A Computer Embedded in Plastic", 27$^{th}$ International SAMPLE Technical Conference, pp17–23, (1995).

IEEE Conference Papers by Klaus Vedder, The Hague, May 4–8, pp. 630–635 (1992).

* cited by examiner

Primary Examiner—Michael G. Lee
Assistant Examiner—Jamara A. Franklin
(74) Attorney, Agent, or Firm—Browdy and Neimark, P.L.L.C.

(57) ABSTRACT

A data transaction card having an interface for bi-directional contactless communication, and comprising a support (20) having a cavity (12) for accommodating therein a chip carrier therein module (10). The chip carrier module comprises a substrate (11) having a first side (45) and a second side (46), and an integrated circuit (30) mounted on the first side of the substrate for managing functions of the data transaction card. A coil antenna (40) is electrically connected to the integrated circuit for inductive coupling with remote antenna, connections to the coil antenna being accessible from the first side of the substrate. The chip carrier module is packaged into one discrete unit so as to be amenable to mechanical assembly of the data transaction card without requiring additional electrical connections between the support and the chip carrier module during or subsequent to assembly. Such a construction allows for efficient mass-production of the data transaction card.

18 Claims, 3 Drawing Sheets

DATA TRANSACTION CARD AND METHOD OF MANUFACTURE THEREOF

CROSS REFERENCE TO RELATED APPLICATION

The present application is the national stage under 35 U.S.C. 371 of PCT/IL98/00543, filed Nov. 9, 1998.

FIELD OF THE INVENTION

The invention relates to a bi-directional communication data transaction card with an onboard processor for effecting both "contact" and "contactless" modes of data transfer.

BACKGROUND OF THE INVENTION

Both "contact" and "contactless" bi-directional communication data transaction cards are known per se. A concise introduction to the nomenclature and principal features of data transaction cards, also called data cards or smart cards, is found in an IEEE Conference Paper by Klaus Vedder, The Hague, May 4–8, 1992, hereinafter referred to as Vedder. Another general overview is given by Gilles Lisimaque in a paper called "Smart Cards" delivered at the 27th. International SAMPE Technical Conference, Oct. 9–12, 1995. Smart cards represent a specific implementation of chip cards wherein the chip is a microcomputer having a programmable memory.

Generally, such smart cards are provided either with electrical contacts for effecting direct electrical contact with a card reader, or with an antenna coil for effecting contactless bi-directional communication with a remote card reader. U.S. Pat. No. 5,206,495 for a Chip Card in the name of H. D. Kreft discloses a chip card allowing both contact and contactless communication in a single smart card.

A principal object of U.S. Pat. No. 5,206,495 is the provision of a chip card including both a contact field and transmission coils and a switching element device coupled between both and a semiconductor device such as a microcomputer.

International Patent Publication No. WO 98/29830, in the name of the present applicant, discloses a contact/contactless data transaction card which automatically conforms to a required communication mode in accordance with whether data is received via the antenna or via the contacts.

Contactless smart cards are particularly suited for applications, such as mass transport systems, wherein data communication must be effected very quickly without imposing the overhead incurred in manually introducing the smart card into the slot of a card reader.

Common to all such smart cards is an on-board microcomputer including a memory and processing capability for effecting the desired bi-directional data transmission and data storage. In the case where "contact" data transmission is required, there is provided a so-called "contact field" having a plurality of contacts, each of which is connected to the microcomputer by means of a respective electrical connection. Data transmission with an external reader is then effected by inserting the card into a suitable reader having a spring-loaded contacts which bear on the respective contacts in the contact field of the chip card.

Alternatively, when contactless data transmission is required, an antenna coil in the chip card is adapted to receive data from and transmit data to a reading device having a similar antenna.

Sometimes, such contact/contactless cards are called hybrid cards. These cards are thus packaged, with at least, components such as contacts, a microcomputer and an antenna.

As smart cards are presently mass-produced by the hundreds of millions, the assembly of the components and their embedding and packaging into the cards must be performed by fast and cost-effective processes. For purposes of compatibility, international standards govern the smart card industry. Thus, the dimensions and the location of the contacts of smart cards are laid down by Part 2 of the International Standard ISO 7816. The card itself, known as "standard identification card" or "ID-1 card", is the size of a regular credit card. The thickness of the card is approximately 0.8 mm.

The ISO 7816 standard defines eight contacts, in two columns of four, but typically, only five or six are put to use. The other two or three are reserved for future utilization and therefore often not provided. Each single contact measures at least 2×1.7 mm. The eight contacts of the contact field are contained in a square of about 10×10 mm, thus covering an area of about 1 cm$^2$. FIG. 1$a$ provides the minimum dimensions of the contacts, their arrangement and their location in the upper left corner of a card, as dictated by the ISO 7816. standard. FIG. 1$b$ gives an example of a contact field with an eight contact layout. The microcomputer or integrated circuit used in a data transaction card is usually integrated on to a single piece of silicon. The size of a chip generally only extends from some 1 mm$^2$ to 16 mm$^2$, with a thickness ranging from 0.1 to 0.2 mm.

Typically, the antenna coil is wound around the periphery of the card, thus having dimensions approximately equal to those of the card and being very much greater than those of the contact field. As a result, the contacts induce no deleterious effect on the operability of the antenna coil. This, however, is not the case when the antenna coil is reduced in size so as to allow for its mounting directly on the integrated circuit. In such case, the close proximity of the mass of metal constituted by the contact field to the antenna coil, can interfere with its operability.

Different designs have been devised for the assembly of the many components of a smart card into a finished product. For example, U.S. Pat. No. 5,589,032 in the name of J-C. Fidalgo provides a bi-directional contact and contactless communication card. Fidalgo describes all the necessary components and suggests ways to facilitate their assembly, their electrical connection and their final integration. Nevertheless, the assembly still requires the laborious addition of components both in the body of the card 2, as well as in the electronic module 7. For example, the antenna 5 is embedded in the body of the card 2 and must be connected to the chip 8 which is itself part of the electronic module 7. Thus the different discrete components must be electrically interconnected. Thus, the card described by Fidalgo is not based on modular building blocks which are amenable for mass assembly.

To alleviate the difficulties encountered with the assembly and connection of the antenna, German Patent No. 37 21 822, in the name of K. Sickert, proposes forming the coil antenna 4 on to the semiconductor of the Integrated Circuit 5, around the active surface of the semiconductor and along its borders. Such a scheme allows the antenna to be provided during the manufacture of the integrated circuit and thus obviates the need electrically to connect the antenna to the integrated circuit in an independent subsequent stage of assembly. However, Sickert limits his invention to the antenna-chip pair and does not deal with further components. Also, since the size of the antenna is necessary limited by the dimensions of the semiconductor wafer, the transmission range is short.

In International Patent Publication No. WO 96/35190, to Reiner, there is suggested a method for contactless inductive coupling of a small antenna to a larger one. As an improvement upon Sickert, a small antenna, along the edges of a substrate, is inductively coupled to a larger antenna, disposed along the edges of the card itself.

SUMMARY OF THE INVENTION

It is an object of the invention to provide a data transaction card constructed by assembly of the body of a card with a chip carrier module.

It is a further object of the invention to provide such a data card wherein all the electronic components reside in the chip carrier module, so that no additional electrical connections are required between the coil antenna and the chip carrier module.

In accordance with a broad aspect of the invention there is provided a data transaction card having an interface for bi-directional contactless communication, the data transaction card comprising:

a support having a cavity for accommodating therein a chip carrier module which comprises:
a substrate having a first side and a second side,
an integrated circuit mounted on the first side of the substrate for managing functions of the data transaction card, and
a coil antenna electrically connected to the integrated circuit for inductive coupling with a remote antenna, connections to the coil antenna being accessible from the first side of the substrate;
the chip carrier module being packaged into one discrete unit so as to be amenable to mechanical assembly of the data transaction card without requiring additional electrical connections between the coil antenna and the chip carrier module during or subsequent to assembly.

Preferably, the chip carrier module hosts an optical visual authentication mark, such as an encoded hologram, formed into a personalized identification mark by insertion of a picture of the bearer of the card as the encoded hologram.

Preferably, the contact/contactless data transaction card further comprises a contact field for contact communication, wherein the card and the contacts are compatible with the 1S0 7816 Standard for contact cards. The contact field includes separate contacts applied on the second side of the substrate, for contact communication between the data transaction card and a card reader.

Preferably, the contact/contactless data transaction card is assembled by use of the conventional methods employed for the production of contact data cards.

In accordance with a preferred embodiment, the antenna comprises more than one winding applied either on the first or second side of the substrate. Alternatively, two antennae may be provided each on an opposite side of the substrate and having the same or a different number of windings. In such case, the two antennae behave as a parallel plate capacitor whose capacitance may be exploited to adjust an operational frequency of a tuned circuit containing the coil antennae. If desired, such tuning may be realized by an external capacitor coupled to the substrate.

Furthermore, it is also preferable for the windings of the coil antenna to be applied along the periphery of the substrate.

The invention also contemplates a method for manufacturing a data transaction card, method comprising the steps of:

(a) providing a support having a cavity therein,
(b) independently producing a chip carrier module having embedded therein an integrated circuit and a coil antenna electrically connected to said integrated circuit without requiring additional electrical connections between the coil antenna and the chip carrier module during or subsequent to assembly without requiring additional electrical connections between the coil antenna and the chip carrier module during or subsequent to assembly, and
(c) mounting the chip carrier module in the cavity of the support.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF PREFERRED EMBODIMENTS

Figure 1A:
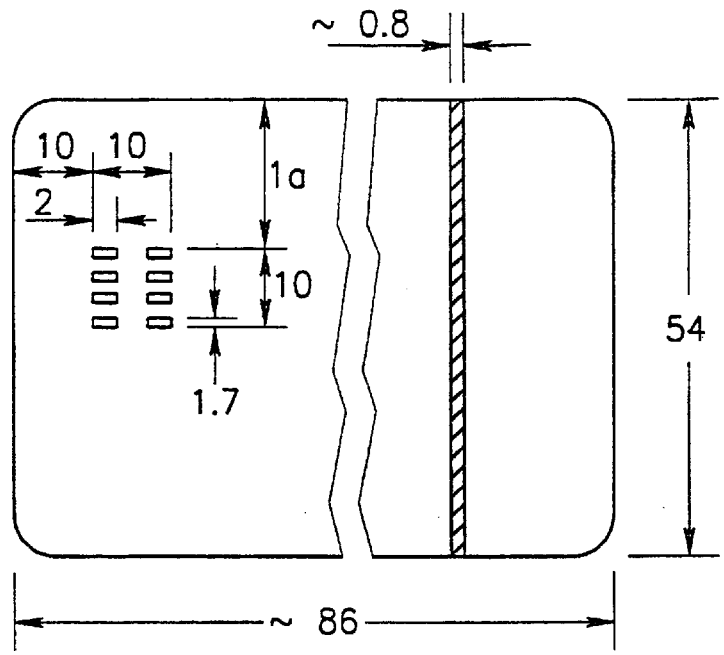
FIG. 1a shows some of the standard dimensions for known contact data communication cards, as dictated by the ISO 7816.
Figure 1B:
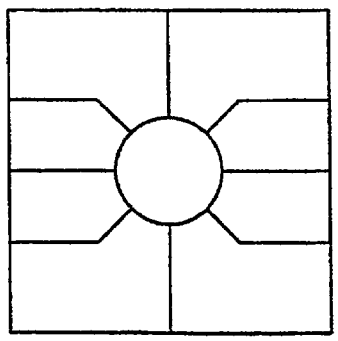
FIG. 1b shows an example of a known contact field with an eight contact layout, as used for contact data communication cards.
Figure 2:
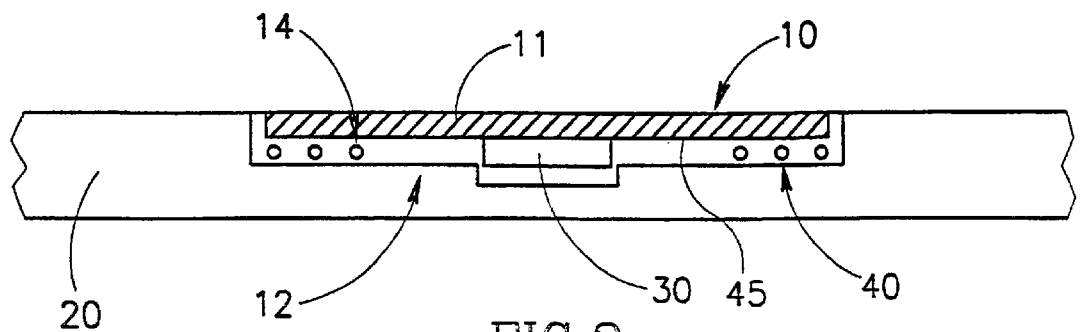
FIG. 2 shows schematically a cross-section of a contactless data communication cards according to a first embodiment of the invention.

FIG. 2 shows a cross-section of a data card according to the present invention having a communications interface for allowing a contactless mode of bi-directional data transmission. The data card includes a chip carrier module 10 having a substrate 11 which is retained in a cavity 12 of a support medium depicted generally as 20.

The substrate 11 provides a foundation for the various components of the card such as an integrated circuit 30 and a coil antenna 40 which are mounted on a lower surface 45 of the substrate 11 (constituting a first side thereof). The integrated circuit 30 manages the various command and control functions of the data transaction card. The coil antenna 40 is likewise formed on the lower side 45 of the substrate 11 around the integrated circuit 30. It is understood that the substrate 11 is a Printed Circuit Board (PCB) on to which the antenna 40 may be etched in known manner. The antenna 40 may also be applied on to the lower side 45 of the substrate 11 by other means, such as deposition, or wires and the like. The leads of the antenna 40 terminate with conductive pads (not shown), by means of which the antenna 40 may be connected to the integrated circuit 30 as will be explained in greater detail below. During a subsequent stage of manufacture following formation of the coil antenna 40, the integrated circuit 30 is mounted on to the lower side 45 of the substrate 11 and secured thereto. The coil antenna 40 may have one or more turns, in a single or multiple layers, according to the requirements for inductive coupling communication between the data card and a suitable remote card reading device.

Figure 3:
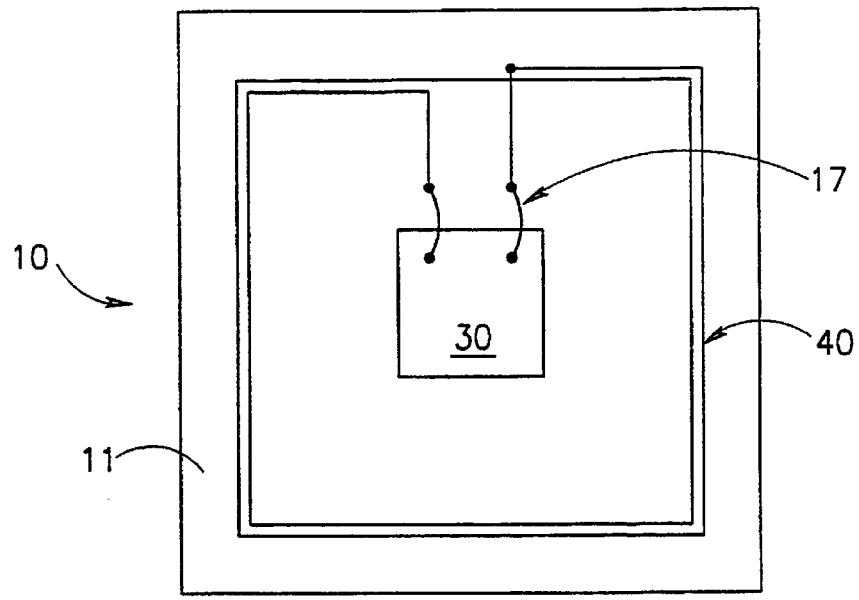
FIG. 3 shows schematically a lower plan view of a substrate for a contactless data communication card according to the invention.

FIG. 3 is a plan view of the lower surface 45 of the substrate 11, showing the antenna 40 electrically connected to the integrated circuit 30 by two wire leads 17. The electrical connections may be performed by wire bonding or any suitable technique. The next step in the production process calls for the sealing of the connections, a method well known in the trade. The substrate 11 together with the associated components and the antenna 40, now packaged into a single discrete unit, constitutes the chip carrier module 10, ready for integration with the support 20 forming the body of data transaction card by mechanical assembly, without requiring any further electrical connections.

The chip carrier module 10 is thus inserted in the cavity 12 until a shoulder 14 of the substrate 11 abuts a corresponding shoulder of the card, thereby bringing the upper side of both card 20 and the chip carrier module 10 flush with each other. The chip carrier module 10 is retained within the cavity 12 by gluing or other processes, according to the finishing steps known in the trade.

Figure 4:
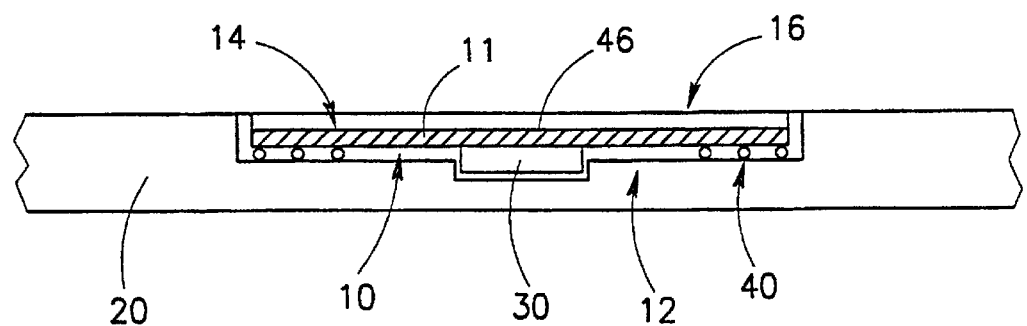
FIG. 4 shows schematically a cross-section of a contactless data communication card in accordance with of a second embodiment of the invention conforming to the layout depicted in FIG. 2.

FIG. 4 shows an optically encoded visual authentication mark 16 which is now applied to an upper surface 46 of the substrate 11 (constituting a second side thereof). The visual authentication mark 16 may be realized as a hologram or an encoded hologram and allows form visible inspection from the outer surface of the card. The visual authentication mark 16 may serve as a personal identification relating to a bearer of the data card. For example, an encoded hologram with the picture of the proprietor of the data card permits simple visual inspection of the authorized owner.

As also seen in FIG. 4, the visual mark 16 is applied to the substrate 11 and assembled in the chip carrier module 10. The assembly process of the chip carrier module 10 comprises the additional step of securing or inscribing the visual mark 16 on to the substrate 11. If the thickness of the visual mark 16 is not negligible, then account must be taken therefor either by making the substrate 11 thinner or by deepening the cavity 12, in order that the overall thickness of the card conforms to the requisite standards. This is of particular importance when the data card is also provided with a contact field for insertion into a slot of an external card reader, since the slot is dimensioned to accept only such data cards as meet the requisite standards.

Figure 5:
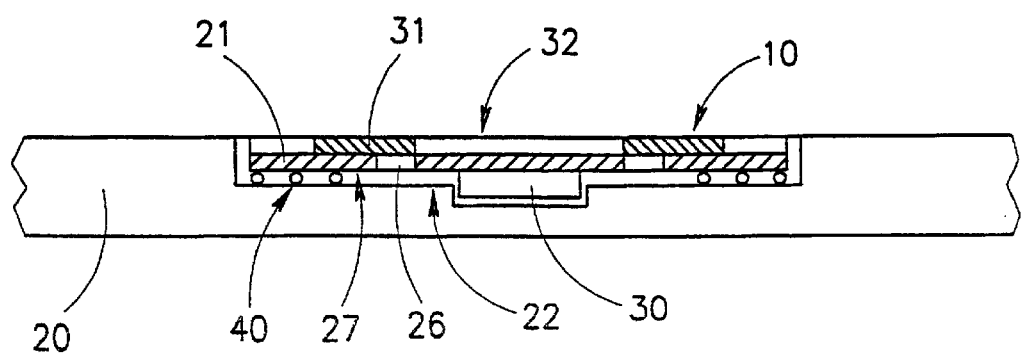
FIG. 5 shows schematically a cross-section of a contact and contactless data communication card in accordance with a third embodiment of the invention.

FIG. 5 shows in cross-section an application of the invention to a data card still having both a contactless interface and a contact field whilst still obviating the need for effecting supplementary electrical interconnections during assembly. To the extent that many of the components in the contact/contactless card are the same as in the contactless card described above, identical reference numerals will be employed.

The support medium 20 of the card supports a chip carrier module 10 retained in a cavity 22 of the card, and which is complementary in shape to the chip carrier module 10. The chip carrier module 10 comprises the substrate 21 on which the various components of the card are mounted. The substrate 21 has a lower surface (constituting a first side), for accommodating therein an integrated circuit 30. As will be explained in greater detail below, the substrate 21 is also provided with several via holes 26 connecting between the lower surface of the substrate to an upper surface thereof (constituting a second side). The substrate 21 further has shoulders 27 for mating with corresponding shoulders in the support medium 20 of the card.

The substrate 21 is produced by any of the well-known Printed Circuit Board manufacturing techniques which provide for the necessary conductors and via holes. The via holes 26 allow for the electrical connection of a coil antenna 40 on the lower surface of the substrate 21 to respective contacts 31 of a contact field on the upper surface of the substrate 21, as will now be explained in greater detail.

The first step of the assembly process requires that the substrate 21 be fitted on the lower surface with a coil antenna 40, applied on the flat area of the shoulders 27. The coil antenna 40 allows for inductive coupling communication with an appropriate remote antenna in a card reader (not shown). The coil antenna 40 may have one or more turns, as well as more than one layer, according to the particular implementation for which the card is intended. To facilitate the electrical connection of the coil antenna 40 to the integrated circuit 30 in later production steps, the ends of the antenna 40 terminate in conductive pads (not shown in FIG. 5), suitably located in the proximity of the integrated circuit.

The first step of the assembly process requires that there be applied to the upper surface of the substrate 21 the contact field including up to eight separate contacts, some of which may be redundant in specific applications. The emplacement and the size of the contact field on the support medium 20, as well as the size and configuration of the separate contacts, are preferably in accordance with ISO 7816. The via holes 26, which are located, in this example, surrounding the integrated circuit 30, are also aligned with, and electrically connected to, the separate contacts 31. By such means, the coil antenna 40 may be connected to the contact field 32 even though they are on opposite sides of the integrated circuit 30. The contact field is dimensioned so as to increase the effectiveness of the coil antenna 40. Specifically the size of the contacts 31 is minimized so that the resulting mass of metal does not interfere with the operability of the coil antenna 40.

Figure 6:
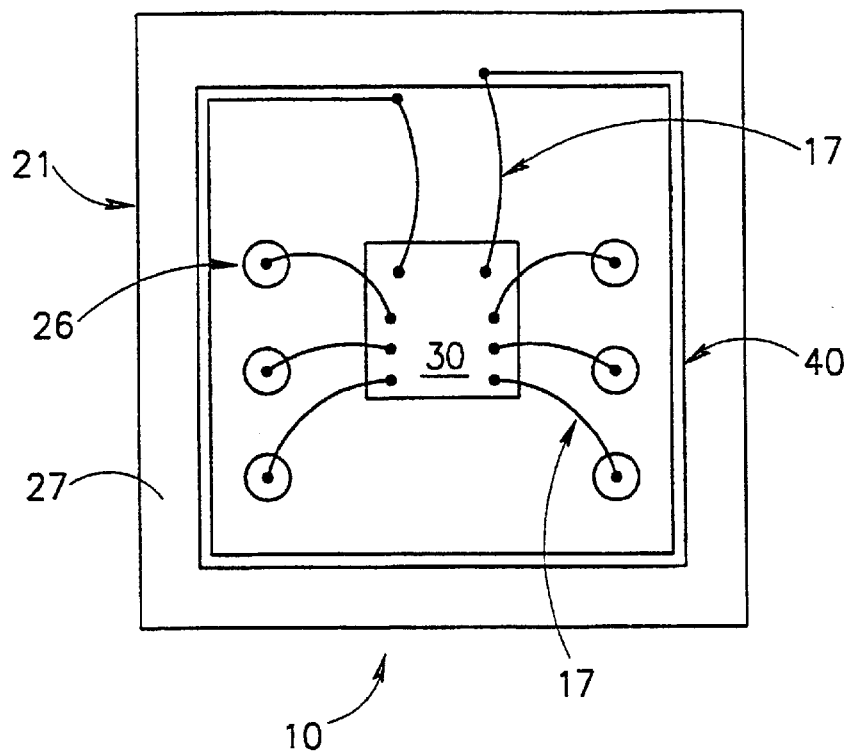
FIG. 6 shows schematically a lower plan view of a substrate for the contact and contactless data communication card illustrated in FIG. 5.

FIG. 6 shows in plan view the lower surface of the substrate 21 illustrating the assembly of the chip carrier module 10. First, the coil antenna 40 is applied to the lower surface of the substrate 21 underneath the shoulders 27 which are provided along the edges of the substrate 21. The ends of the coil antenna 40 on the shoulders 27 are connected through conductive leads, to pads (not shown) in the vicinity of the integrated circuit 30, for connection thereto by wire bonding 17. The contact field having six separate contacts 31 (shown in FIG. 5) is now applied to the upper surface of the substrate 21.

This having been done, the integrated circuit 30 is located and secured on the lower surface of the substrate 21, whereupon the integrated circuit 30 is electrically connected to the contacts 31 and to the antenna 40 by electrical wire connections 17, using wire bonding. Wire bonds are thus routed on the lower surface of the substrate 21, from the integrated circuit 30 to the two end pads (not shown) of the coil antenna 40. From there, they are routed to the corresponding via holes, connecting from the lower surface to the upper surface of the substrate 21, so as to make electrical contact with the separate contacts 31 residing on the upper surface of the substrate. Finally, the substrate 21 is encapsulated using known techniques so that the resulting chip carrier module 10 is amenable to machine assembly without demand for further electrical connections. The chip carrier module 21 is mounted on to the support medium 20 until the shoulders 27 of the substrate 20 abut a corresponding shoulder of the support medium, thereby bringing the upper side of both card and module flush with each other. The spatial disposition of the cavity 22 relative to the support medium 20 as well as the dimensions and separation of the individual contacts are selected so that the contact field conforms to ISO 7816.

Figure 7:
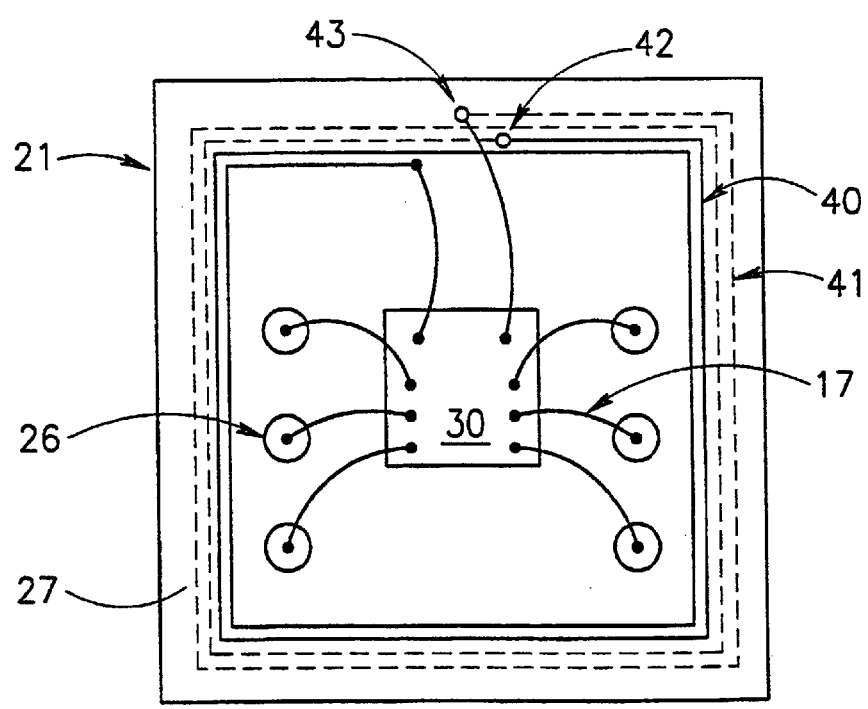
FIG. 7 shows schematically the contact and contactless data communication card shown in FIG. 5 in accordance with a fourth embodiment of the invention.

FIG. 7 shows schematically the lower surface of the substrate 21 with the coil antenna 40 mounted on a peripheral shoulder 27 thereof. Likewise, a second coil antenna 41 connected in series with the first coil antenna 40, is mounted on the upper surface of the substrate 21. The integrated circuit 30 is wire-bonded to the first end of the first coil antenna 40, on the lower surface of the substrate 21. The second end of the first coil antenna 40 is connected via a first plated through hole 42 to the first end of the second coil antenna 41 (shown in dotted outline) located on the upper surface of the substrate. Likewise, the second end of the second coil antenna 41, also on the upper surface of substrate 21, is connected via a second plated through hole 43 which itself is wire bonded to the integrated circuit 30. Such a double antenna provides an augmented captive area and thus achieves enhanced communication performance.

It is also possible to exploit the capacitance inherent between the two coil antennae 40 which behave as a parallel plate capacitor to tune the chip carrier module 10 to a desired working frequency, such as the resonant frequency of a data reader antenna. The operational frequency of the coil antennae is a function of the capacitance between the two coils. This avoids the separate connection to a discrete capacitor thereby reducing the bulk of the tuned circuit. Nevertheless, if desired, an additional external capacitor may be connected to the chip carrier module 10, in order to provide for the necessary tuning.

Whilst a preferred embodiment of the invention has been described in detail, it is apparent that may modifications and variations thereto are possible, all of which fall within the true spirit and scope of the invention. For example, if desired the integrated circuit 30 may be offset relative to the middle of the substrate 21. Also, other configurations are possible for the coil antenna 40 which may be adapted to suit microwave transmission.

What is claimed is:

1. A data transaction card having an interface for bi-directional contactless communication, the data transaction card comprising:
    a support having a cavity for accommodating therein a chip carrier module which comprises:
        a substrate having a first side and a second side,
        an integrated circuit mounted on the first side of the substrate for managing functions of the data transaction card, and
        a coil antenna formed in the substrate around the integrated circuit and electrically connected via the substrate to the integrated circuit for inductive coupling with a remote antenna, connections to the coil antenna being accessible from the first side of the substrate;
        the chip carrier module being packaged into one discrete unit so as to be amenable to mechanical assembly of the data transaction card without requiring additional electrical connections between the coil antenna and the chip carrier module during or subsequent to assembly.

2. The data transaction card according to claim 1, further comprising:
    an optical visual authentication mark applied to the second side of the substrate, so as to remain visible after packaging into the chip carrier module and after assembly of the chip carrier module with the support.

3. The data transaction card according to claim 2, wherein the visual authentication mark is a hologram.

4. The data transaction card according to claim 2, wherein the visual authentication mark is an encoded hologram which forms a personal identification of an authorized bearer of the data transaction card.

5. The data transaction card according to claim 4, wherein the encoded hologram is a picture of the authorized bearer of the data transaction card.

6. The data transaction card according to claim 1, wherein the substrate further comprises:
    a contact field with separate contacts applied on the second side of the substrate, for contact communication between the data transaction card and a card reader.

7. The data transaction card according to claim 6, wherein the contact field conforms to ISO 7816.

8. The data transaction card according to claim 6, wherein
    the cavity is spatially disposed relative to the support so that when the chip carrier module is assembled on to the support, the contact field conforms to ISO 7816.

9. The data transaction card according to claim 6 wherein contact field is dimensioned so as to increase the effectiveness of the coil antenna.

10. The data transaction card according to claim 6 having an overall thickness no greater than 0.8 mm.

11. The data transaction card according to claim 1, wherein the coil antenna is applied on the first side of the substrate.

12. The data transaction card according to claim 11, further comprising:
    a second coil antenna mounted on the second side of the substrate and being connected to the first coil antenna and to the integrated circuit by electrical interconnections passing from the first side of the substrate to the second side thereof.

13. The data transaction card according to claim 12, wherein the first and second coil antennae are provided each with a different number of windings.

14. The data transaction card according to claim 13, wherein:
    the first and second coil antennae behave as a parallel plate capacitor, and
    an operational frequency of the coil antennae is a function of a capacitance of said parallel plate capacitor.

15. The data transaction card according to claim 12, wherein:
    the first and second coil antennae behave as a parallel plate capacitor, and
    an operational frequency of the coil antennae is a function of a capacitance of said parallel plate capacitor.

16. The data transaction card according to claim 1, wherein the coil antenna is applied on to the second side of the substrate, and is connected to the integrated circuit by electrical interconnections passing from the first side of the substrate to the second side thereof.

17. The data transaction card according to claim 1, wherein the coil antenna is applied along a periphery of the chip carrier module.

18. A method for manufacturing a data transaction card, said method including the steps of:
    (a) providing a support having a cavity therein,
    (b) independently producing a chip carrier module including a substrate having a coil antenna formed therein around an integrated circuit mounted on the substrate and connected via the substrate to the coil antenna, and
    (c) mounting the chip carrier module in the cavity of the support.

* * * * *